United States Patent [19]

Bumgardner

[11] 4,092,701
[45] May 30, 1978

[54] ULTRA HIGH INPUT IMPEDANCE/VOLTAGE RANGE AMPLIFIER

[75] Inventor: Jon H. Bumgardner, Ridgecrest, Calif.

[73] Assignee: The United States of America as represented by the Secretary of the Navy, Washington, D.C.

[21] Appl. No.: 748,594

[22] Filed: Dec. 8, 1976

[51] Int. Cl.² .............................................. H03F 3/04
[52] U.S. Cl. ..................................... 330/297; 330/300
[58] Field of Search ....................... 330/22, 24, 35, 40, 330/38 M, 32, 199, 202

[56] References Cited

U.S. PATENT DOCUMENTS

| 3,233,185 | 2/1966 | Young | 330/40 X |
| 3,453,554 | 7/1969 | Shoemaker | 330/38 M X |
| 3,678,402 | 7/1972 | Tempel | 330/35 X |

OTHER PUBLICATIONS

Danilović et al., "Voltage Stabilization of the Source-Follower Operating Point", *Electronic Engineering*, Feb. 1969, pp. 221–223.
Todd, "Simplify DC Amplifier Design by Using FETs", *Electronic Design*, Feb. 1, 1966, pp. 64–68.
Thompson, "A Very High Input Impedance Buffer Using Field Effect Transistors", *Electronic Engineering*, Jun. 1966, pp. 370–373.

*Primary Examiner*—James B. Mullins
*Attorney, Agent, or Firm*—R. S. Sciascia; Roy Miller; W. Thom Skeer

[57] ABSTRACT

An ultra high input impedance and input voltage range amplifier wherein a low voltage input stage is cascaded with an emitter follower transistor stage which provides an excess current sink to keep the voltage across the input stage at a low value.

2 Claims, 2 Drawing Figures

ULTRA HIGH INPUT IMPEDANCE/VOLTAGE RANGE AMPLIFIER

BACKGROUND OF THE INVENTION

The present invention relates to solid state amplifiers, and more particularly to an amplifier circuit having a high input impedance and high input voltage range.

In measuring circuits, it is sometimes necessary to present a very high input impedance to the circuit being measured so as not to affect its performance. Also buffer amplifiers are required to provide isolation between a high impedance transducer, such as a condenser microphone or an electrostatic accelerometer, and its load. Such high impedance requirements are typically limited to insulated gate field effect transistors (IGFET) and junction effect transistors (JET) as sensing devices, replacing the previous vacuum tube cathode follower and transistor emitter follower circuits.

For ultra low leakage current applications, the IGFET is the most desirable choice. Since these devices are usually limited to 15–30 volt power supply voltages, maximum, a usual measurement limitation is to impose a few dozen volts working voltage range. Thus, for applications where a measurement range of hundreds or thousands of volts is needed, these devices are not suitable.

SUMMARY OF THE INVENTION

Accordingly, the present invention provides a high impedance amplifier with specifically a high input voltage range which uses a low voltage, low leakage current input sensing stage. In one embodiment, the sensing stage is provided with a wide tolerance constant current source and is cascaded with an emitter follower transistor having a Zener diode in the emitter circuit to limit the voltage that the input stage "sees" to a reasonable and safe value. The input stage may be an IGFET in a source follower configuration, or for optimum performance, an operational amplifier in a voltage follower configuration.

DESCRIPTION OF THE PREFERRED EMBODIMENT

Figure 1:
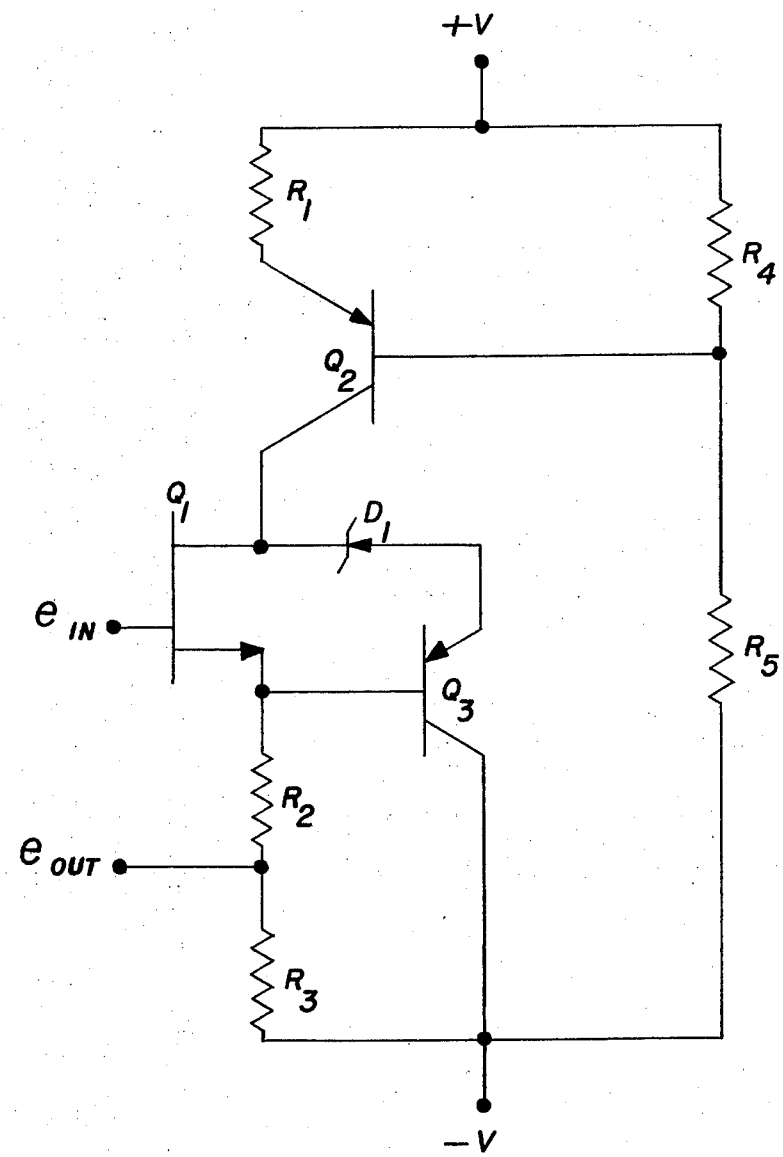
FIG. 1 is a schematic diagram of one embodiment of the present invention.

Referring now to FIG. 1. $Q_1$ is field effect transistor configured as a source follower. An input voltage, $e_{in}$, is applied to the gate of $Q_1$ and a scaled down output voltage, $e_{out}$, is taken from the junction of resistors $R_2$ and $R_3$ in the $Q_1$ source circuit. $R_2$ and $R_3$ are connected as a voltage divider network between the $Q_1$ source and negative terminal, $-V$, of a power supply.

A PNP transistor, $Q_2$, collector is connected to the $Q_1$ drain and emitter connected through resistor $R_1$ to the positive terminal, $+V$, of the power supply. $R_1$ establishes the $Q_2$ collector current. Bias for $Q_2$ is provided by the voltage divider network of $R_4$ and $R_5$ connected between $-V$ and $+V$, with the $Q_2$ base connected to the junction of $R_4$ and $R_5$.

A PNP transistor $Q_3$ is cascaded with $Q_1$ and is configured as an emitter follower, to provide an "excess current sink" for $Q_2$ with the $Q_3$ base connected to the $Q_1$ source and the $Q_3$ collector connected to $-V$. The $Q_3$ emitter is connected to the $Q_1$ drain through a reverse biased Zener diode $D_1$.

The power supply differential voltage is high enough so that the JET $Q_1$ operates linearly for all anticipated input voltage values. The Zener diode $D_1$ establishes the voltage, $V_{ps}$, across $Q_1$, which is generally of the order of 5 to 15 volts. Transistors, $Q_2$ and $Q_3$ are high voltage bipolar transistors since they will "see" to within a few volts of the full power supply voltage from $-V$ to $+V$. Thus, $Q_1$ never has to "see" any voltage greater than approximately a dozen volts because $Q_2$, $Q_3$, $R_1$, $R_2$, and $R_3$ drop virtually all of the high voltage of the power supply.

Figure 2:
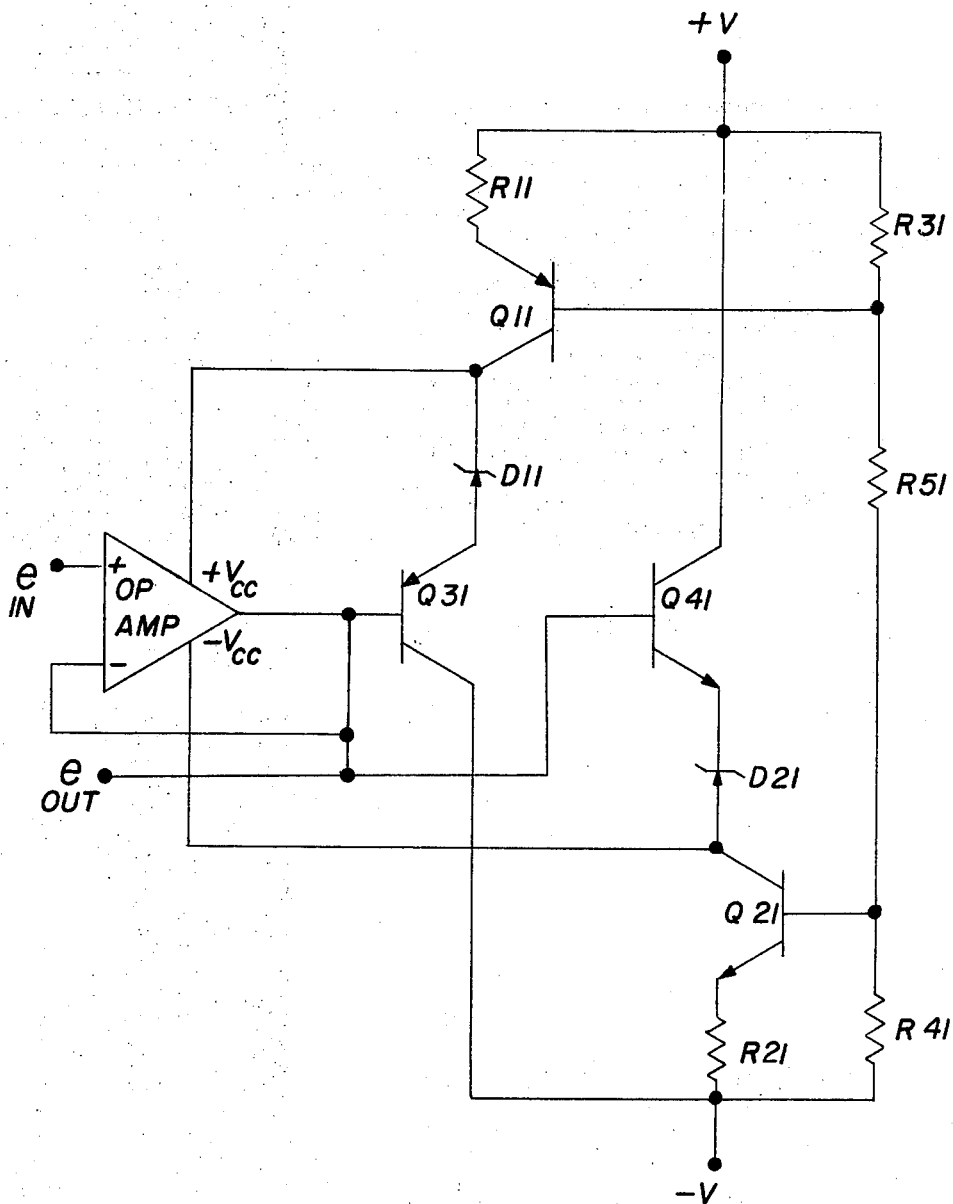
FIG. 2 is a schematic diagram of a second embodiment of the present invention which uses an operational amplifier.

FIG. 2 illustrates how a commercially available operational amplifier (OP AMP) can be used as a basic circuit building block, allowing a normally low voltage OP AMP to be chosen strictly on the merit of low input leakage current and offset voltage. The basic circuit desired is a voltage follower to provide high input impedance.

The positive voltage terminal, $+V_{cc}$, of an OP AMP is connected through a PNP transistor $Q_{11}$ to the positive terminal, $+V$, of a power supply. $Q_{11}$ is configured as a current source with its collector connected to $+V_{cc}$ and its emitter connected through current determining resistor $R_{11}$ to $+V$. Likewise, the negative voltage terminal, $-V_{cc}$, of the OP AMP is connected through a PNP transistor $Q_{21}$, configured as a current source with resistor $R_2$ as the current determining resistor, to the negative terminal, $-V$, of the power supply.

PNP transistors $Q_{31}$ and $Q_{41}$ are connected to the output of the OP AMP and are configured as emitter followers. The collectors of $Q_{31}$ and $Q_{41}$ are connected to $-V$ and $+V$, respectively, and the respective emitters are connected through reverse biased Zener diodes $D_{11}$ and $D_{21}$ to $+V_{cc}$ and $-V_{cc}$ respectively.

A voltage divider network of resistors $R_{31}$, $R_{41}$ and $R_{51}$ between $+V$ and $-V$ provide bias voltages to the $Q_{11}$ and $Q_{21}$ bases at the $R_{31}$ and $R_{51}$ junction and the $R_{41}$ and $R_{51}$ junction, respectively. An input voltage, $e_{in}$, is applied to the non-inverting input of the OP AMP, and an output voltage, $e_{out}$, is obtained at the output of the OP AMP with unity gain.

The OP AMP is effectively "floated" to be used over very large (hundreds or thousands of volts) voltage ranges. It not only provides a unity gain buffer with high input impedance, but it also controls the very circuitry which regulates where the "float point" voltage is.

The transistors $Q_{11}$, $Q_{21}$, $Q_{31}$ and $Q_{41}$ are high voltage bipolar transistors capable of operating at the full power supply differential voltage, but the Zener diodes $D_{11}$ and $D_{21}$ and the output connected transistors $Q_{31}$ and $Q_{41}$ limit the OP AMP voltages $+V_{cc}$ and $-V_{cc}$ to a reasonable and safe value by passing all current not needed by the OP AMP to the appropriate power supply terminal. The power supply voltage is great enough to allow proper current source and OP AMP operation over the entire input-output voltage operating range; usually the supply differential is of the order of 2 to 18 volts greater than the $e_{in}$ operating range, depending on the exact circuit characteristics desired and chosen.

The circuit incorporating the operational amplifier has several advantages over the first embodiment, among which are: circuit simplicity; large current source tolerance, thereby permitting the use of low cost ultra high voltage components; arbitrarily low input offset currents may easily be obtained through proper choice of OP AMPs; and arbitrarily low distortion may be obtained with accuracies to 0.001% or better because of the large amount of positive feed forward and equally large feedback available.

Also, note that a voltage divider between $E_{out}$ and $-V$ (or any other terminal voltage for that matter) may be added as is done with $R_2$ and $R_3$ in FIG. 1 to provide scaled down output voltages.

What is claimed is:

1. A high impedance amplifier comprising:
   a field effect transistor connected as a source follower and having a high impedance input, a source, and a drain;
   a current source including a transistor directly connected in a circuit with the drain of said field effect transistor;
   a Zener diode directly connected across the source and drain of said field effect transistor and being reverse biased to maintain a predetermined voltage thereacross;
   a current sink including a transistor having a collector, an emitter directly connected to said Zener diode, and a base directly connected to the souce of said field effect transistor; and
   impedance means directly connected between said source of said field effect transistor and the collector of the transistor current sink for providing an impedance matched output therefor, whereby said high impedance amplifier is protected from high voltage transents appearing at the high impedance input of said field effect transistor.

2. A high input impedance amplifier comprising:
   an operational amplifier having two input terminals, positive and negative voltage supply terminals, and an output terminal for producing an electrical output which is a function of the signal difference appearing at the input terminals;
   a source of positive voltage;
   a source of negative voltage;
   a first current source including a first transistor having a collector directly connected to said positive voltage supply terminal of said operational amplifier and having an emitter connected to said source of positive voltage;
   a second current source including a second transistor having a collector directly connected to said negative voltage supply terminal of said operational amplifier and having an emitter connected to said source of negative voltage;
   a first Zener diode having two terminals the first of which is directly connected to said positive voltage supply terminal of said operational amplifier;
   a second Zener diode having two terminals the first of which is connected to said negative voltage supply terminal of said operational amplifier;
   a third transistor having a base directly connected to said output terminal of said operational amplifier, a collector directly connected to said source of negative voltage, and an emitter directly connected to the second terminal of said first Zener diode;
   a fourth transistor having a base directly connected to said output terminal of said operational amplifier, a collector directly connected to said source of positive voltage, and an emitter directly connected to the second terminal of said first Zener diode, whereby said operational amplifier is protected from transiant voltage transents in excess of its rated input appearing across the two input terminals.

* * * * *